United States Patent [19]

Monett

[11] Patent Number: 4,929,894
[45] Date of Patent: May 29, 1990

[54] METHOD AND APPARATUS FOR INCREASING THROUGHPUT ON DISK DRIVE QUALITY CONTROL TESTING

[75] Inventor: Michael R. Monett, Santa Clara, Calif.

[73] Assignee: Memory Technology, Boulder, Colo.

[21] Appl. No.: 235,404

[22] Filed: Aug. 23, 1988

[51] Int. Cl.⁵ .................... G01R 33/12; G11B 27/36
[52] U.S. Cl. ................................. 324/212; 324/227; 360/31
[58] Field of Search ............... 324/210, 211, 212, 227, 324/262; 360/31; 371/21, 25

[56] References Cited

U.S. PATENT DOCUMENTS 4,746,995  5/1988  Rauskolb ..................... 324/212

Primary Examiner—Reinhard J. Eisenzopf
Assistant Examiner—Walter E. Snow
Attorney, Agent, or Firm—Ronald C. Fish

[57] ABSTRACT

A method and apparatus for increasing the throughput of memory disk drive quality control testing. The apparatus consists of a delay line for delaying the input signal from the read circuitry by one period of said input signal. A difference amplifier subtracts the delayed input signal from the undelayed input signal and couples the difference to one input of a comparator. The comparator compares the difference signal to a threshold used to indicate the presence of an "additional pulse". This test is performed simultaneously with a "missing pulse" test. The method involves delaying the input signal by one period and subtracting the delayed signal from the undelayed signal. A comparison of the difference to a predetermined threshold is then performed and where the threshold is exceeded, the corresponding location on the track under test is recorded as a probable defect. This method is performed simultaneously with a conventional method of performing a "missing pulse" test.

5 Claims, 2 Drawing Sheets

METHOD AND APPARATUS FOR INCREASING THROUGHPUT ON DISK DRIVE QUALITY CONTROL TESTING

BACKGROUND OF THE INVENTION

The invention relates to the field of testing for defects on the surface or surfaces of rotating, magnetic bulk memories of the fixed disk variety, i.e., what are commonly referred to in the computer business as hard disks. More specifically, the invention relates to an apparatus and method for at least doubling the throughput of conventional quality control testing for defects on the surfaces of such hard disks by allowing simultaneous performance of two different kinds of tests whereas in the prior art, the two different kinds of tests had to be performed sequentially.

So called hard disks are comprised of a rigid substrate upon which is coated a thin film of magnetic media. Various types of defects can exist on the surface of the hard disk. Some of these defects relate to defects in the magnetic film while others relate to defects in the flatness of the substrate. These defects are significant since in the process of reading magnetic data stored on the hard disk in the form of magnetic transitions recorded in the thin magnetic film, electrical transitions or pulses are generated and these defects can degrade the amplitude of these pulses and the phase relationship of these pulses to timing windows which are used to read the transitions. That is, binary ones and zeros are recorded in the form of transitions from one magnetic polarity to another magnetic polarity on a portion of the magnetic film called a track. A magnetic read head flies over this track during the read process, and the magnetic transitions on the surface of the film generate tiny magnetic field variations which the read head flies through. When the read head flies through such a transition in the magnetic field, a pulse is generated in the read head. The read circuitry looks for such transitions during timing windows. An amplitude threshold is used in this process. If the pulse so generated does not exceed the amplitude threshold or does not occur within the timing window, the read circuitry will assume that no pulse existed. In fact, what may have happened is that a defect caused the electrical pulse which would normally have been generated as the read head flew over that particular portion of the track to be weak, i.e., low in amplitude, or the defect caused the pulse to occur outside the timing window. In either event, the read circuitry would assume that no pulse and thus no transition occurred at that particular portion on the track thereby resulting in an error in reading the data recorded at that location.

The normal process for testing the magnetic film and substrate for defects is to record a fixed pattern of transitions on each track on each surface of the disk to be tested and then to read these transitions on all the tracks and all the surfaces. This process comprises the first phase of testing. During this first phase, the presence of known transitions at all bit locations on the track are tested for by use of amplitude thresholds and timing windows. If a pulse is found to be "missing" at any particular location by virtue of the pulse representing that location being lower than the amplitude threshold or shifted in phase so as to be outside the timing window, then that location is marked as a defect in a header table. The header table is an area on the magnetic surface which is recorded with information which comprises an index to all the byte locations on the disk which are recordable and all those byte locations on the disk which are not recordable by virtue of there being a defect at one or more of the bit locations which comprise the byte location.

The second phase of quality control testing is then entered. In the second phase of testing, all of the tracks on all of the surfaces are erased. The tracks are then read again. An erased track does not have any recorded transitions, but the signal resulting from reading the track is not a completely flat DC level. There is noise at the output of the read circuitry which results from various sources. Among these sources of noise are the read head amplifiers and various mechanical variations. Among these mechanical variations are the variations in the disk speed, variations in the flatness of the substrate and variations in the repeatability of the head positioning over the particular track being read.

The second phase of testing is accomplished by setting thresholds on either side of the zero signal output level above which the noise level does not rise. Defects will cause what are called "extra pulses" to appear. These extra pulses take the form of pulses which exceed the threshold on either side of the zero signal output level.

Thus, it can be seen that complete quality control testing of a hard disk system using conventional methods and apparatus requires at least one set of revolutions to record all the tracks, one set of revolutions to read all the tracks, one set of revolutions to erase all the tracks and one set of revolutions to read all the erased tracks. Typically, multiple sets of revolutions in each of these phases is performed to detect all defects. This is because not all defects will show up on a single pass of recording and reading or erasing and reading. Therefore, to insure that all defects are detected, multiple passes are used.

Therefore, a need has arisen for a system which can increase the throughput of this testing process. This need is becoming more and more critical as the capacity of disk drives increases steadily with improving technology.

SUMMARY OF THE INVENTION

According to the teachings of the invention, there is disclosed an apparatus and method for performing both the "missing pulse" and the "additional pulse" tests simultaneously. According to the method of the invention, the input waveform from the read circuitry connected to the head is delayed for an interval equal to one cycle of the periodic waveform. The input waveform is periodic since the tracks to be tests have been recorded with test data in the form of transitions of magnetic orientation that causes a periodic signal to be inductively caused in the read head or heads as the head or heads flies over the tracks being read. The missing pulse test is performed by comparing the amplitudes of the signals in the input waveform to thresholds set so as to detect areas on the track where the amplitudes of the undulations in the input waveform fall short of the thresholds. There are also timing windows associated with these thresholds. These timing windows indicate the interval during which a transition is expected. If a transition is recorded in the location on the track corresponding to the timing window, and the magnetic media and substrate at that location is of acceptable quality, an undulation will be caused in the input waveform which peaks during the timing window and has an amplitude which exceeds the threshold value. If the quality of the magnetic media or substrate is defective, is often happens that the transition recorded at the defect location causes an undulation in the input waveform which either peaks outside the timing window or which peaks at an amplitude which is less than the threshold level. The comparison of the amplitudes of the undulations of the input waveform to the threshold values is done during the timing windows. If either the timing of the peak is outside the timing window or the amplitude of the peak is less than the threshold, the location is marked in an error table as a defect by virtue of failing the "missing pulse" test.

The method of performing the "additional pulse" test simultaneously with the performance of the "missing pulse" test requires a delay and a difference measurement. That is, the input waveform is delayed by one cycle and then the delayed input waveform is measured against the undelayed waveform to determine the difference between the voltages of the waveforms at two points in the input waveform separated in time by an interval equal to the period of the waveform. This measurement results in the generation of a difference signal which is effectively the same as the input waveform would have been if the track under test had been completely erased and then read by passing the read head over the track. The difference signal is then compared to another pair of thresholds that are set appropriately to discriminate between the normal noise found in the input waveform and the added pulse which often shows up at defect locations.

An apparatus according to the teachings of the invention utilizes a delay line having its output coupled to one input of a difference amplifier and an input for receiving the input waveform from the test circuitry. The input waveform is coupled to the input of the delay line and is also coupled to the other input of the difference amplifier. The output of the difference amplifier is applied to one input of a comparator. The other input of the comparator is coupled to a reference voltage which sets the threshold for the "additional pulse" test.

The same ideas may be used for quality control testing of optical disk drives which have flaws similar to those found in magnetic disk media.

DESCRIPTION OF THE PREFERRED EMBODIMENT

Figure 1:
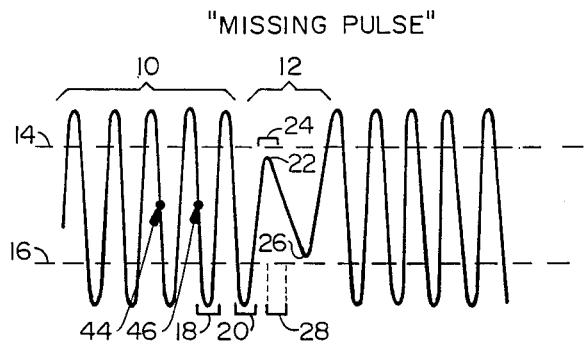
FIG. 1 is a waveform diagram illustrating the effects of a typical defect as shown by the output waveform of typical disk test circuitry while performing a "missing pulse" test.
Figure 2:
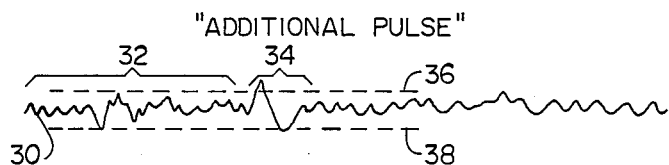
FIG. 2 is a waveform diagram illustrating the effects of a typical defect as shown by the output waveform of typical disk test circuitry while performing an "additional pulse" test.

Referring to FIGS. 1 and 2 there are shown typical input waveforms that are output from the output of the read circuitry of a disk drive quality control testing system. FIG. 1 represents the input waveform (hereafter the phrase "input waveform" refers to the output of the read circuitry of the disk drive testing system which is the input waveform to the system according to the teachings of the invention) which represents the transitions of test data recorded on the track under test. FIG. 2 represents the input waveform that results from passing the read head over the same track after the test data on the track has been erased.

In FIG. 1, the waveform segment marked 10 represents the normal waveform resulting from passing the read head over a segment of track which does not have any defects. On the other hand, the waveform segment marked 12 represents the waveform which may result when the read head is passed over a defect such a pit in the substrate or other flaw. The normal waveform shown at 10 can take many different forms for different formats of recorded test data. However, in all formats, data is recorded by causing a magnetic transition in the magnetization of the media and is read by looking for the pulse which results from this transition during a timing window set to occur as the head passes over the location on the track where the transition is supposed to occur. If a pulse having the proper amplitude results during the corresponding timing window, a successful read has occurred, and the track location has acceptable quality. In FIG. 1, the dashed lines 14 and 16 represent the positive and negative thresholds and selected ones of the timing windows are symbolized by the brackets 18 and 20. In the case of the timing windows 18 and 20, successful reads have occurred indicating these locations on the track are of acceptable quality. However, at the location of the defect, the peak 22 falls short in amplitude of the threshold 14 and indicates a missing pulse, even though the peak 22 is within the interval defined by the timing window 24. Some defects have the effect of either reducing the amplitude of the peak or changing the phase of the peak relative to the location of the timing window. The peak 26 represents a peak where the phase has been shifted relative to the timing interval by the effects of the defect at the location of this transition. For the peak 26, the missing pulse test is failed on account of both the amplitude of the peak being less than (in absolute value) the value of the threshold 16 and by virtue of the fact that the peak 26 occurs outside the timing window represented by the bracket 28.

Referring to FIG. 2, the portion of the input waveform 30 labeled 32 is the normal read signal from an erased track. The noise evident in this portion of the signal results from various sources such as positioning errors for the head, speed variations of the disk and noise in the read circuitry amplifiers (now shown). The portion of the input waveform labeled 34 represents an "additional pulse" defect in the sense that the defect at this location causes a pulse to appear at this location where no pulse is supposed to appear. The thresholds 36 and 38 represent the thresholds that are used to discriminate between the noise in segment 32 and the additional pulse within segment 34.

Figure 3:
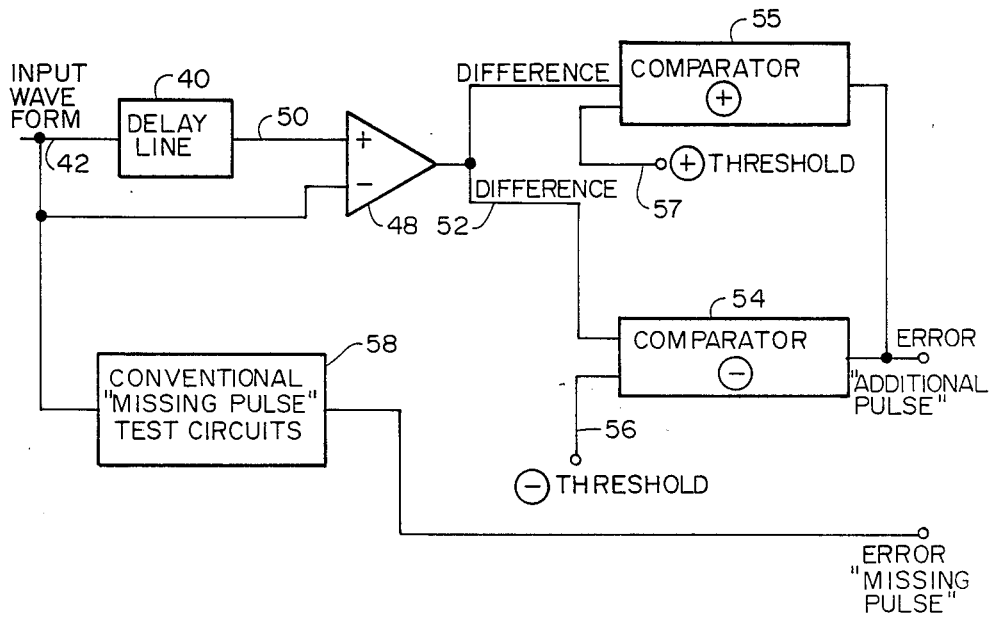
FIG. 3 is a block diagram of the preferred embodiment of the apparatus of the invention.

Referring to FIG. 3, there is shown a block diagram of a circuit constructed in accordance with the teachings of the invention. In this preferred embodiment, a delay line 40 receives the input waveform on line 42 and delays it for an interval equal to one period (or some integer multiple of one period) of the input waveform. In FIG. 1, this delay interval is equal to the time between the points 44 and 46 in the waveform shown in segment 10. The output of the delay line is coupled to one input of a difference amplifier 48. The other input of this difference amplifier is coupled directly to the input waveform on line 42. The difference amplifier subtracts the voltage on line 50 from the voltage on line 42 and outputs the difference as the DIFFERENCE signal on line 52. This signal is applied to one input of each of two comparators 54 and 55. The other input of each of the comparators 54 and 55 is coupled to an appropriate reference voltage which represents one of the threshold levels 36 or 38 in FIG. 2. In the case of comparator 54, the other input 56 is coupled to a reference voltage which represents the negative threshold 38. In the case of comparator 55, the other input is coupled to a reference voltage with represents the positive threshold 36. The comparator 54 compares the DIFFERENCE signal on line 52 to the negative threshold level 38, and if the threshold is exceeded, changes states. The output of the comparator 54 indicates that no error has occurred and no defect exists until the output changes states. When this happens, conventional circuitry not shown marks the location corresponding to the change in states of the comparator as a defect location. The comparator 55 performs the same function for the positive threshold represented by the threshold voltage on line 57.

Conventional "missing pulse" detection circuitry simultaneously conducts the "missing pulse" test on the input waveform on line 42 as the "additional pulse" testing is carried out by the other circuitry of FIG. 3. Thus, both tests can be carried out in one set of revolutions to write the test data and one set of revolutions to read the test data as opposed to one set of revolutions to write the test data, one set of revolutions to read the test data for the "missing pulse" test, one set of revolutions to erase the test data and one set of revolutions to read the erased tracks. In reality, each of these operations and tests is typically carried out many times on each unit being tested to insure repeatability of the location of defects. Thus, it can be seen that as disk drive density increases, the invention becomes more and more valuable. Use of the invention will at least double testing throughput.

Figure 4:
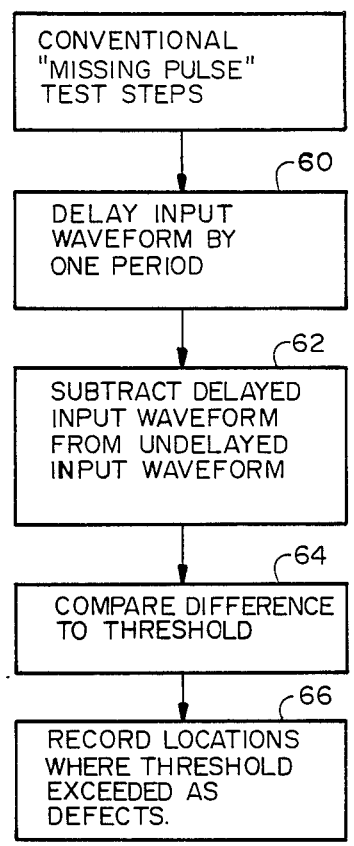
FIG. 4 is a flow diagram of the preferred embodiment of the method of the invention.

Referring to FIG. 4, there is shown a flow chart of one method according to the teachings of the invention. The first step is to delay the input waveform by an interval equal to one period of the input waveform. Next, the delayed signal and the undelayed signal of the input waveform are subtracted from one another to determine the difference in amplitude between the two waveforms as symbolized by block 62. Next, the difference is compared to a threshold to determine the locations of defects as symbolized by block 64. Finally, the locations where the threshold was exceeded are recorded as defects as symbolized by block 66. Obviously, this method can be carried out in many different ways by either analog or digital circuitry All such embodiments are intended to be included within the scope of the claims appended hereto.

What is claimed is:

1. An apparatus for increasing throughput for disk drive quality control testing comprises of "missing pulse" and "extra pulse" tests comprising:
   means for writing test data on the tracks to be tested of a disk drive;
   means for reading said test data and for simultaneously performing said "missing pulse" and "extra pulse" tests; and
   wherein said means for reading comprises:
      delay means for receiving a periodic input signal indicative of the magnetic transitions embodying said test data and for delaying said input signal by an interval equal to one period of said input signal;
      difference means coupled to receive said delayed input signal and to receive an undelayed version of said input signal, for subtracting the delayed input signal from said undelayed input signal to determine the difference between the amplitudes of these two signals and for generating a signal indicative of said difference;
      comparator means having an input for receiving a reference signal representative of a test threshold used in said "extra pulse" test and coupled to receive the output of said difference means, for comparing said difference signal to said threshold and for generating an error signal indicating when said difference signal exceeds said threshold, said error signal indicating the location of a probable defect on the track under test.

2. An apparatus for increasing throughput for testing systems for defects in rotating disk bulk storage magnetic memories said testing system having a read head and read circuitry comprising:
   an input port for receiving an output signal from said read circuitry;
   delay means having an input coupled to said input port and having an output, for delaying the signal received at said input for a time equal to an integer multiple of the period of said signal received at said input and for presenting said delayed signal at said output;
   difference means having an output having a first input coupled to said output of said delay means and having a second input coupled to said input port, for detecting the difference in amplitude between the signals at said first and second inputs and for generating a signal at said output which is proportional to said difference; and
   comparator means having an output and having a first input coupled to said output of said difference means and having a second input coupled to a port for receiving a reference potential for comparing the signal at said first input to said reference potential and for generating a signal at said output when the signal at said first input exceeds said reference potential.

3. A method for increasing the throughput of quality control testing of disk drives comprising:
   delaying a periodic input signal indicative of the magnetic transitions of recorded test data by an interval equal to one period of said input signal;
   subtracting said delayed input signal from said input signal to determine the difference amplitude between these two signals; and
   comparing said difference amplitude to a predetermined threshold.

4. The method of claim 3 further comprising the steps of simultaneously performing a conventional "missing" pulse test while the steps of claim 3 are being performed.

5. An apparatus for testing disk drives comprising:
   means for delaying a periodic input signal for an interval equal to one period of the input signal;
   means for subtracting said delayed input signal from said input signal to generate a difference signal;
   means for comparing said difference signal to positive and negative threshold values; and
   means for simultaneously comparing said input signal to a threshold during a predetermined time interval.

* * * * *